(12) United States Patent
Padmanabhan et al.

(10) Patent No.: US 7,109,571 B1
(45) Date of Patent: Sep. 19, 2006

(54) METHOD OF FORMING A HERMETIC SEAL FOR SILICON DIE WITH METAL FEED THROUGH STRUCTURE

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 247 days.

(21) Appl. No.: 10/832,786

(22) Filed: Apr. 26, 2004

Related U.S. Application Data

(60) Division of application No. 10/170,506, filed on Jun. 13, 2002, now Pat. No. 6,746,956, which is a continuation-in-part of application No. 10/004,977, filed on Dec. 3, 2001, now Pat. No. 6,677,235.

(51) Int. Cl.
*H01L 21/44* (2006.01)
(52) U.S. Cl. ................................ 257/667; 257/459
(58) Field of Classification Search ............... 257/774, 257/620, 698; 438/667, 459, 613, 698
See application file for complete search history.

(56) References Cited

U.S. PATENT DOCUMENTS

| | | | |
|---|---|---|---|
| 3,928,093 A | 12/1975 | Van Tongerloo et al. ... | 148/186 |
| 3,937,579 A | 2/1976 | Schmidt .................... | 356/144 |
| 4,189,820 A | 2/1980 | Slack ........................ | 29/425 |
| 4,261,781 A | 4/1981 | Edmonds et al. .......... | 156/254 |
| 4,782,028 A | 11/1988 | Farrier et al. ............... | 437/3 |
| 5,142,756 A | 9/1992 | Ibaraki et al. ............ | 29/25.01 |
| 5,166,097 A | 11/1992 | Tanielian .................. | 437/203 |
| 5,200,634 A | 4/1993 | Tsukada et al. ............ | 257/291 |
| 5,240,882 A | 8/1993 | Satoh et al. ............... | 437/226 |
| 5,250,460 A | 10/1993 | Yamagata et al. .......... | 437/62 |
| 5,362,683 A | 11/1994 | Takenaka et al. .......... | 437/226 |
| 5,426,072 A | 6/1995 | Finnila ..................... | 437/208 |
| 5,530,552 A | 6/1996 | Mermagen et al. ........ | 356/401 |
| 5,608,237 A | 3/1997 | Aizawa et al. ............. | 257/132 |
| 5,627,106 A | 5/1997 | Hsu .......................... | 438/459 |
| 5,702,976 A | 12/1997 | Schuegraf et al. .......... | 437/67 |
| 5,739,067 A | 4/1998 | DeBusk et al. ............ | 438/618 |
| 5,742,094 A | 4/1998 | Ting ......................... | 257/620 |
| 5,910,687 A * | 6/1999 | Chen et al. ................ | 257/784 |
| 5,956,605 A | 9/1999 | Akram et al. ............. | 438/613 |
| 5,973,396 A | 10/1999 | Farnworth ................ | 257/698 |
| 6,010,951 A | 1/2000 | Pushpala et al. ........... | 438/458 |
| 6,015,726 A | 1/2000 | Yoshida .................... | 438/202 |
| 6,110,825 A | 8/2000 | Mastromatteo et al. .... | 438/667 |
| 6,187,677 B1 | 2/2001 | Ahn ........................ | 438/667 |
| 6,221,769 B1 | 4/2001 | Dhong et al. .............. | 438/667 |
| 6,249,136 B1 * | 6/2001 | Maley ...................... | 324/765 |

(Continued)

FOREIGN PATENT DOCUMENTS

JP           64-19729          1/1989

(Continued)

*Primary Examiner*—Roy Potter
(74) *Attorney, Agent, or Firm*—Mark C. Pickering

(57) ABSTRACT

A semiconductor die is formed in a process that forms a trench opening in the semiconductor material prior to the formation of the contacts and the metal-1 layer. When contacts are then formed to contact circuit structures, such as a doped region in the top surface of the semiconductor material, a trench contact is formed that fills up the trench opening. During the final steps of the process, the back side of the semiconductor material is ground down to expose the trench contact. The wafer is cut to form a plurality of dice, and the exposed edges of the dice are protected.

18 Claims, 15 Drawing Sheets

U.S. PATENT DOCUMENTS

| | | | | |
|---|---|---|---|---|
| 6,252,300 B1 * | 6/2001 | Hsuan et al. | ................ | 257/686 |
| 6,479,382 B1 | 11/2002 | Naem | ......................... | 438/658 |
| 2002/0025667 A1 | 2/2002 | Farnworth | .................. | 438/612 |

FOREIGN PATENT DOCUMENTS

JP          05-090353          4/1993

* cited by examiner

METHOD OF FORMING A HERMETIC SEAL FOR SILICON DIE WITH METAL FEED THROUGH STRUCTURE

RELATED INVENTIONS

This is a divisional application of application Ser. No. 10/170,506 filed on Jun. 13, 2002, now U.S. Pat. No. 6,746,956 issued on Jun. 8, 2004, which is a continuation-in-part of application Ser. No. 10/004,977 filed on Dec. 3, 2001, now U.S. Pat. No. 6,677,235 issued on Jan. 13, 2004, to Visvamohan Yegnashankaran et al. for Silicon Die with Metal Feed Through Structure.

BACKGROUND OF THE INVENTION

1. Field of the Invention

The present invention relates to a silicon die and, more particularly, to a hermetic seal for silicon die with a metal feed through structure.

2. Description of the Related Art

It is a common practice to permanently connect a silicon die to a semiconductor package. The package often has a multi-layered substrate with internal routing that provides an electrical connection between a number of package bonding pads on the top side of the package, and a number of pins or solder bumps on the bottom side of the package.

Inside the package, very fine bonding wires are used to provide an electrical connection between a number of die bonding pads on the top surface of the die, and the package bonding pads. The die bonding pads, in turn, are electrically connected to a semiconductor integrated circuit.

FIG. 1 shows a cross-sectional diagram that illustrates a conventional ball grid array package 100. As shown in FIG. 1, package 100 includes a substrate 110 that has a top surface 112 and a bottom surface 114. Substrate 110 also has a number of housing bonding pads 116 that are formed on top surface 112, and a number of contact pads 120 that are formed on bottom surface 114. In addition, substrate 110 has a number of solder balls 122 that are attached to contact pads 120, and internal routing 124 that electrically connects the housing bonding pads 116 to the solder balls 122 via the contact pads 120. Solder balls 122, in turn, are shown connected to a printed circuit board 126

As further shown in FIG. 1, package 100 also includes a die 130 that is attached to top surface 112 of substrate 110. Die 130, in turn, has a number of die bonding pads 132 that are electrically connected to a semiconductor integrated circuit. Package 100 additionally includes a number of very fine bonding wires 134 that connect the housing bonding pads 116 to the die bonding pads 132, and an encapsulant 136 formed over substrate 110 and die 130.

One advantage provided by package 100 is that the manufacturing process required to fabricate package 100 is well known and understood. Package 100, however, suffers from a number of well-known disadvantages. One drawback to housing 100 is that, although the manufacturing process required to fabricate package 100 is well known and understood, package 100 is nonetheless costly to fabricate.

Another drawback to package 100 is that bonding wires 134 have additional inductance which, in turn, decreases the performance of the semiconductor integrated circuit. Thus, there is a need for a method of connecting a die to a semiconductor package that is less expensive than conventional approaches, and eliminates the need for bonding wires.

SUMMARY OF THE INVENTION

The present invention provides a die, and a method of forming the die, that substantially reduce the cost to connect the die to a semiconductor package, and eliminate the need for bonding wires. A semiconductor die formed in accordance with the present invention includes a semiconductor material that has a top surface, a bottom surface, and a plurality of edges. Each edge is connected to the top and bottom surfaces.

The die also includes a doped region that is formed in the top surface of the semiconductor material, and a layer of insulation material that is formed on the top surface of the semiconductor material. In addition, the die includes a first conductive contact that is formed through the layer of insulation material to make an electrical connection with the doped region, and a second conductive contact that is formed through the layer of isolation material and the semiconductor material. The second conductive contact extends from the bottom surface of the semiconductor material to the top surface of the layer of isolation material.

In addition, the die includes a first metal-1 trace and a second metal-1 trace. The first metal-1 trace is formed on the layer of insulation material and the first contact to make an electrical connection with the first contact. The second metal-1 trace is formed on the layer of insulation material and the second contact to make an electrical connection with the second contact.

The die further includes a layer of isolation material that is formed on the layer of insulation material, the first metal-1 trace, and the second metal-1 trace. The die additionally includes an edge protector that contacts and covers the edges.

The present invention also includes a method of processing a wafer. The wafer has a semiconductor material that has a top surface and a bottom surface. The wafer also has a doped region that is formed in the top surface of the semiconductor material, and a plurality of trench openings that are formed in the semiconductor material.

In addition, the wafer includes a layer of insulation material that is formed on the top surface of the semiconductor material. The layer of insulation material has a top surface, a first opening that exposes the doped region, and a plurality of second openings that expose the trench openings. The wafer further includes a first contact that is formed in the first opening, and a plurality of second contacts that are formed in the second openings and the trench openings.

The wafer additionally includes a first metal trace that is connected to the first contact, a second metal trace that is connected to the second contact, and a layer of passivation material that is formed over the layer of insulation material, the first metal trace, and the second metal trace.

The method includes the steps of removing the bottom surface of the semiconductor material to expose the second contacts, and mounting the wafer on an adhesive material after the second contacts have been exposed. In addition, the method includes the step of cutting the wafer to form a plurality of first dice after the wafer has been mounted. The wafer has a plurality of first die-to-die openings with first widths. Each first die has a plurality of exposed edges.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
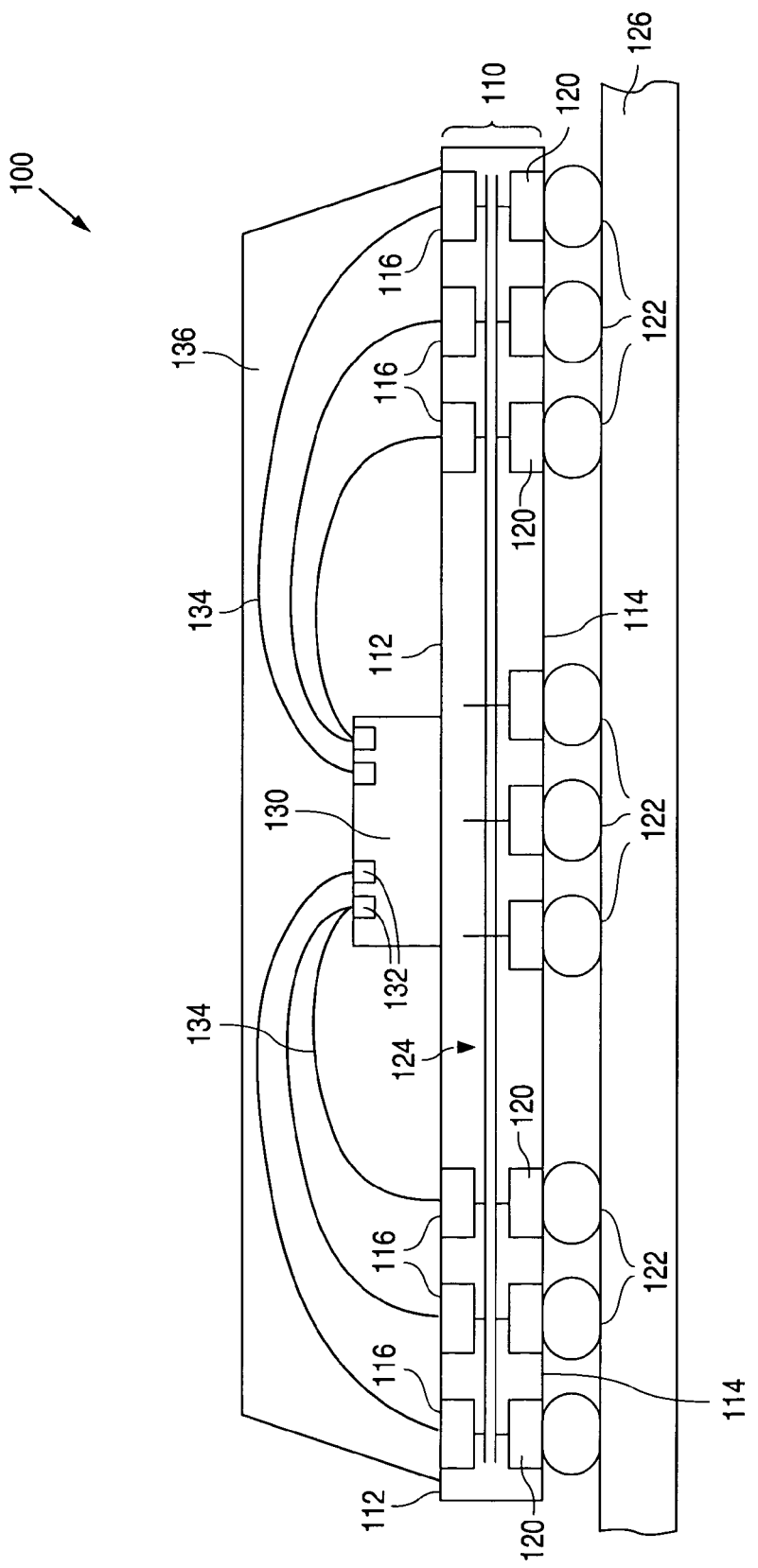
FIG. 1 is a cross-sectional diagram illustrating a conventional ball grid array package 100.
Figure 2A:
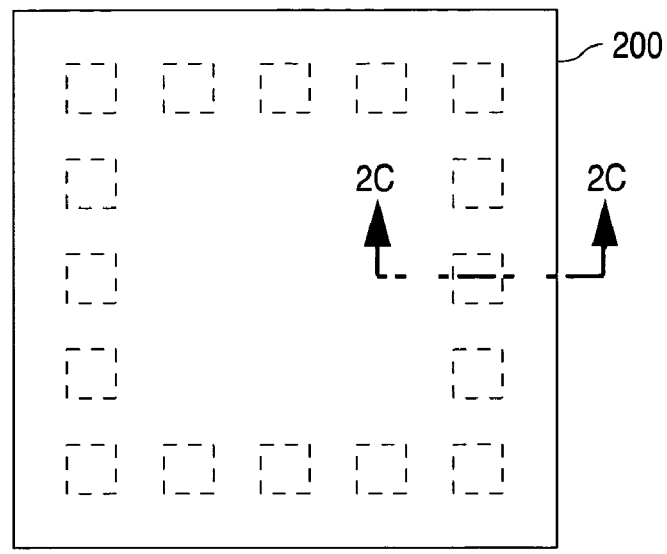
FIG. 2A is a plan view illustrating an example of a semiconductor die 200 in accordance with the parent invention.
Figure 2B:
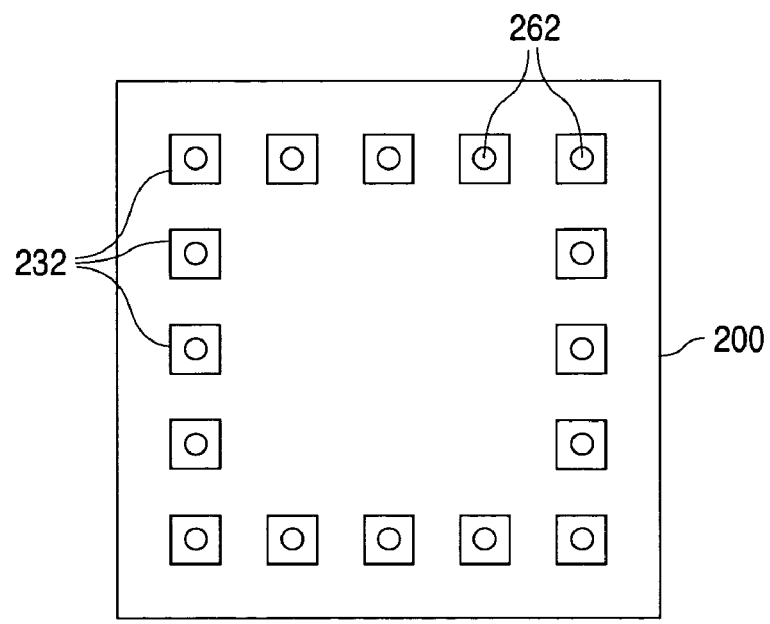
FIG. 2B is a bottom view of semiconductor die 200.
Figure 2C:
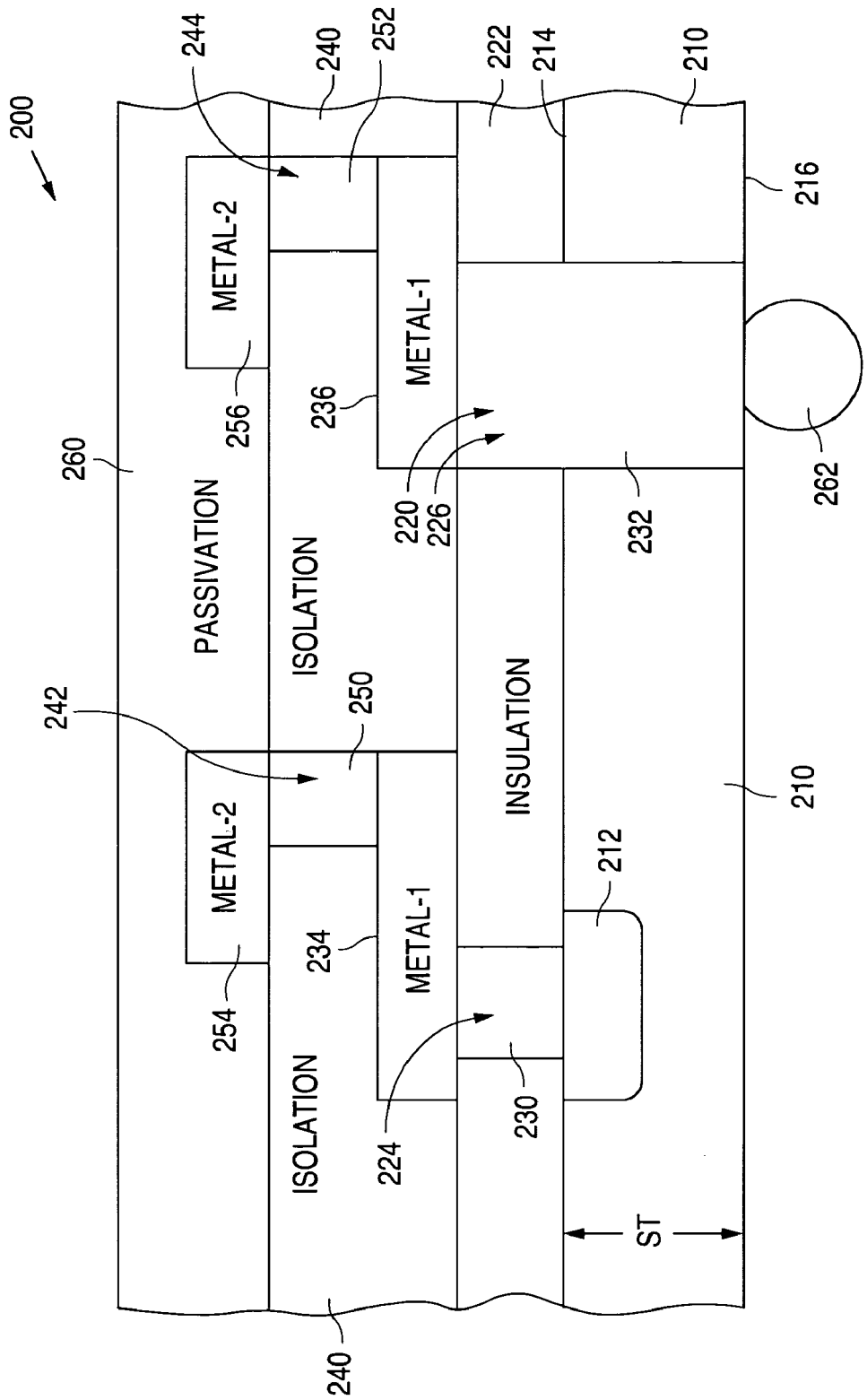
FIG. 2C is a cross-sectional view of semiconductor die 200 taken along line 2C—2C in FIG. 2A.

FIG. 2A shows a plan view that illustrates an example of a semiconductor die 200 in accordance with the parent invention. FIG. 2B shows a bottom view of semiconductor die 200. FIG. 2C shows a cross-sectional view of semiconductor die 200 taken along line 2C—2C in FIG. 2A.

As shown in FIGS. 2A–2C, die 200 includes a semiconductor substrate 210, and a doped region 212 that is formed in substrate 210. Substrate 210 has a top surface 214, an opposing bottom surface 216, and a number of trench openings 220 that are formed through substrate 210. In the example shown in FIG. 2C, substrate 210 has a substrate thickness ST that is approximately equal to one mil.

Doped region 212, which is a part of a semiconductor circuit that is formed on substrate 210, can have the same or an opposite conductivity type as substrate 210. When substrate 210 and doped region 212 share the same conductivity type, doped region 212 has a greater dopant concentration than substrate 210.

In addition, die 200 also includes an insulation layer 222 that is formed on top surface 214. Insulation layer 222, which can be implemented with, for example, a layer of oxide, has a first opening 224 and a number of second openings 226 that are formed through insulation layer 222. First opening 224 exposes the top surface of doped region 212, while second openings 226, which correspond with the number of trench openings 220, are formed substantially in register with trench openings 220.

Die 200 further includes a first contact 230 and a number of second contacts 232. First contact 230, which is formed in first opening 224, makes an electrical connection with doped region 212. Second contacts 232 are formed in trench openings 220 and second openings 226 so that the bottom surfaces of contacts 232 are substantially coplanar with bottom surface 216, and the top surfaces of contacts 232 are substantially coplanar with the top surface of contact 230.

As further shown in FIG. 2C, die 200 includes a first metal-1 trace 234 and a number of second metal-1 traces 236. First metal-1 trace 234 is formed on insulation layer 222 and first contact 230 to make an electrical connection with first contact 230. The second metal-1 traces 236 are formed on insulation layer 222 and the second contacts 232 to make electrical connections with the second metal-1 traces 236. In an alternate embodiment, first metal-1 trace 234 can be connected to one of the second metal-1 traces 236.

In addition, die 200 includes an isolation layer 240 that is formed on insulation layer 222, metal-1 trace 234, and metal-1 traces 236. Isolation layer 240, which can be implemented with, for example, a layer of oxide, has a first opening 242 and a number of second openings 244 that are formed through isolation layer 240. First opening 242 exposes the top surface of metal-1 trace 234, while second openings 244 expose the top surfaces of metal-1 traces 236.

Die 200 further includes a first via 250 and a number of second vias 252. First via 250, which is formed in first opening 242, makes an electrical connection with metal-1 trace 234. Second vias 252, which are formed in second openings 244, make electrical connections with the metal-1 traces 236.

As further shown in FIG. 2C, die 200 includes a first metal-2 trace 254 and a number of second metal-2 traces 256. First metal-2 trace 254 is formed on isolation layer 240 and first via 250 to make an electrical connection with first via 250. The second metal-2 traces 256 are formed on isolation 240 and the second vias 252 to make electrical connections with the second metal-2 traces 256. In an alternate embodiment, first metal-2 trace 254 can be connected to one of the second metal-2 traces 256.

In addition, die 200 further includes a layer of passivation material 260, such as nitride or nitride and an underlying layer of oxide, that is formed on metal-2 traces 254 and 256. Further, die 200 can include a number of solder balls 262 that are formed on the bottom ends of contacts 232.

Figure 3A:
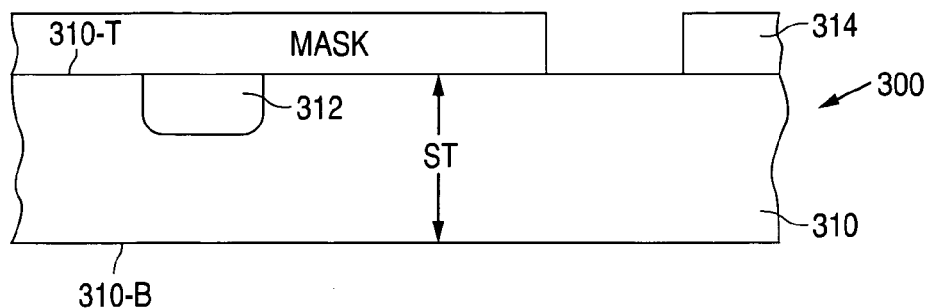
FIGS. 3A–3P are cross-sectional views illustrating an example of a method of processing a semiconductor wafer 300 to form a die, such as die 200, in accordance with the parent invention.
Figure 3B:
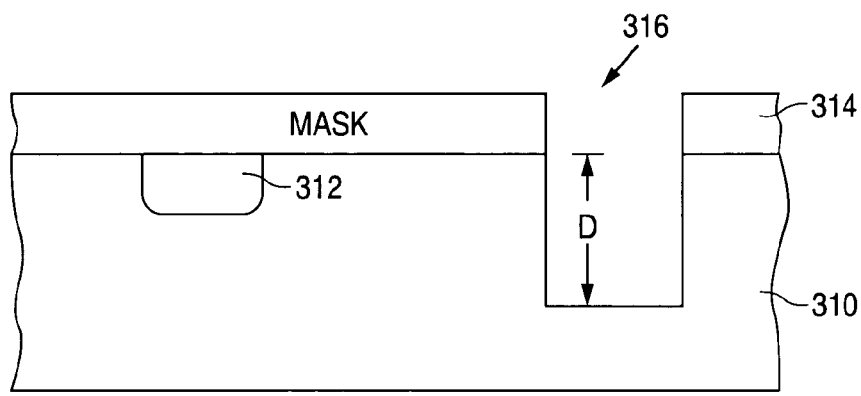
Figure 3C:
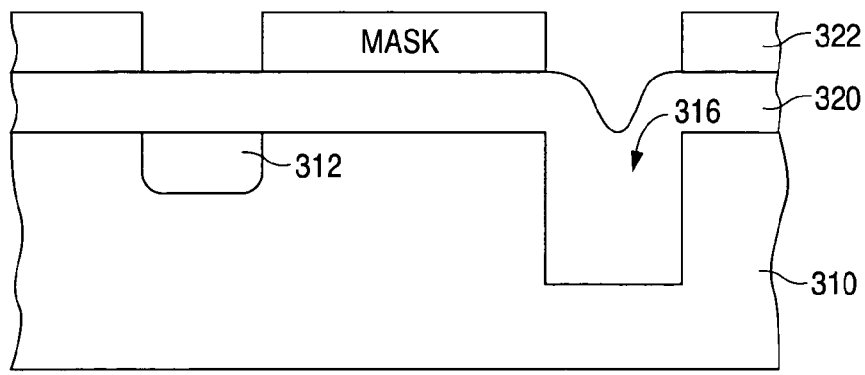
Figure 3D:
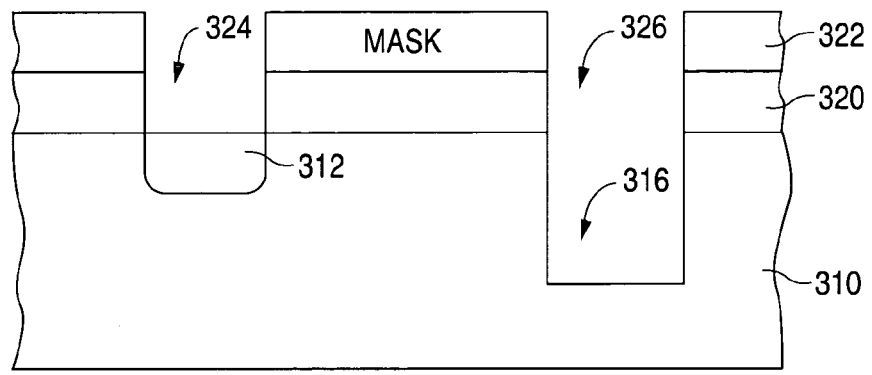
Figure 3E:
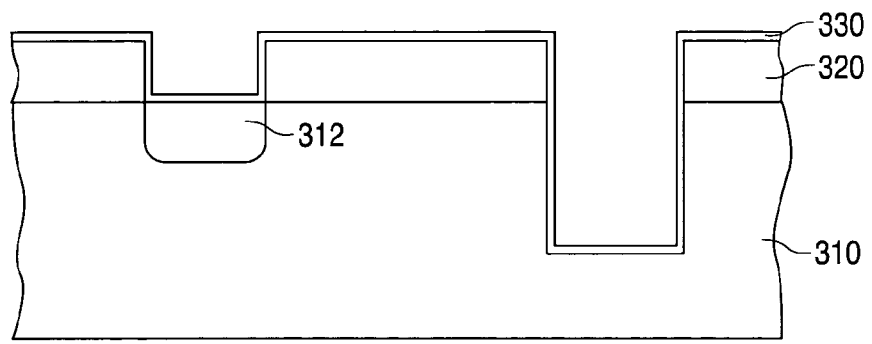
Figure 3F:
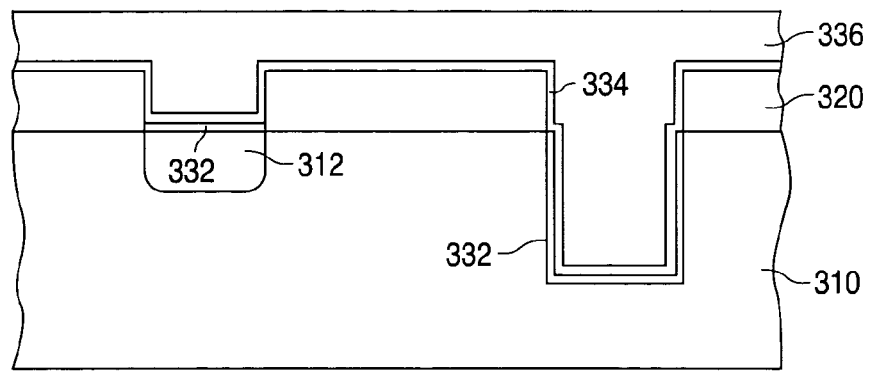
Figure 3G:
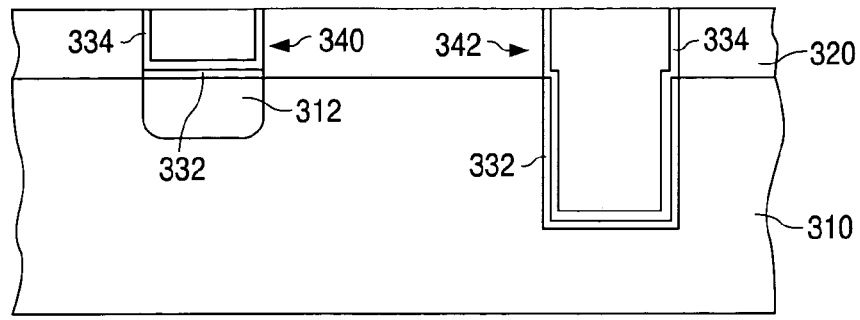
Figure 3H:
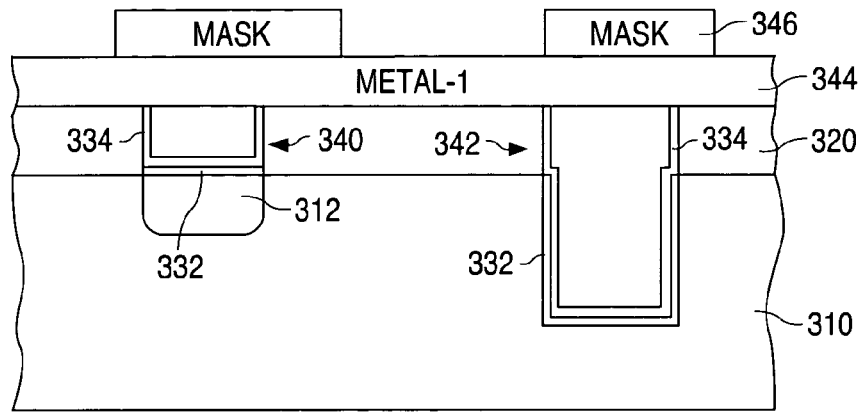
Figure 3I:
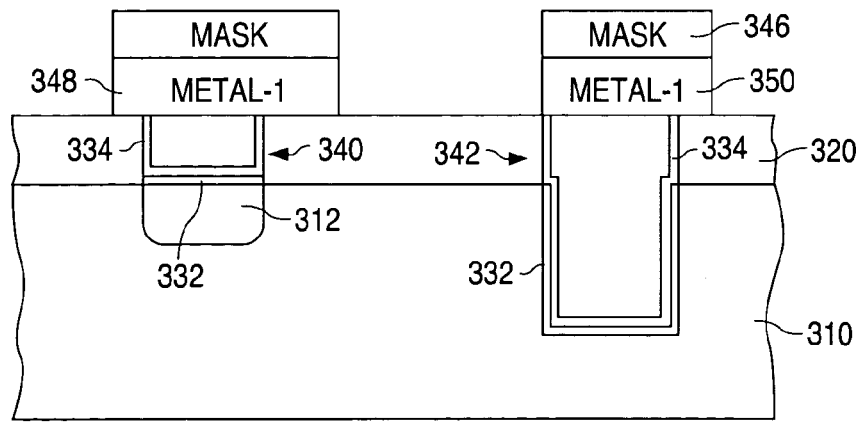
Figure 3J:
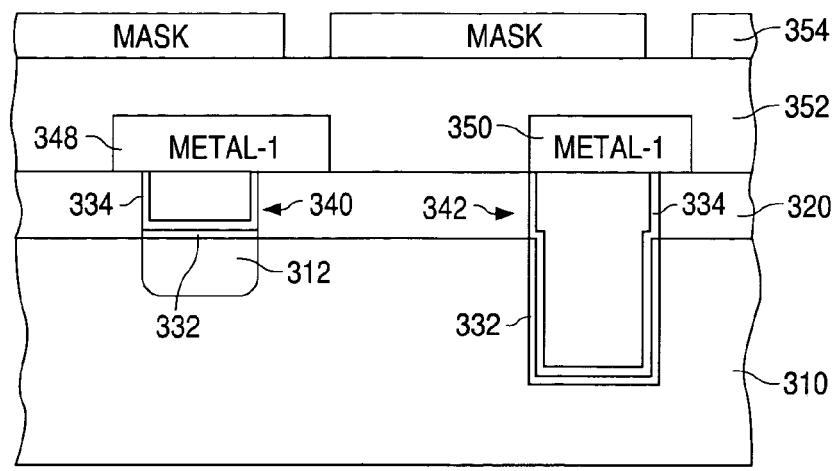
Figure 3K:
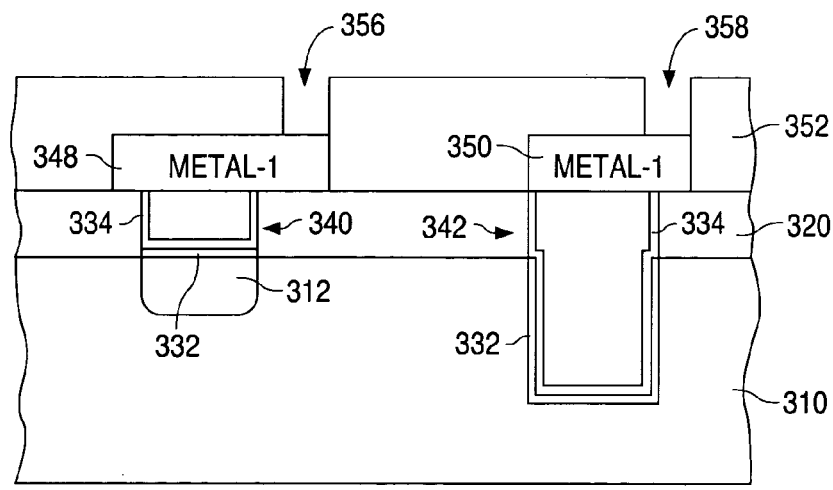
Figure 3L:
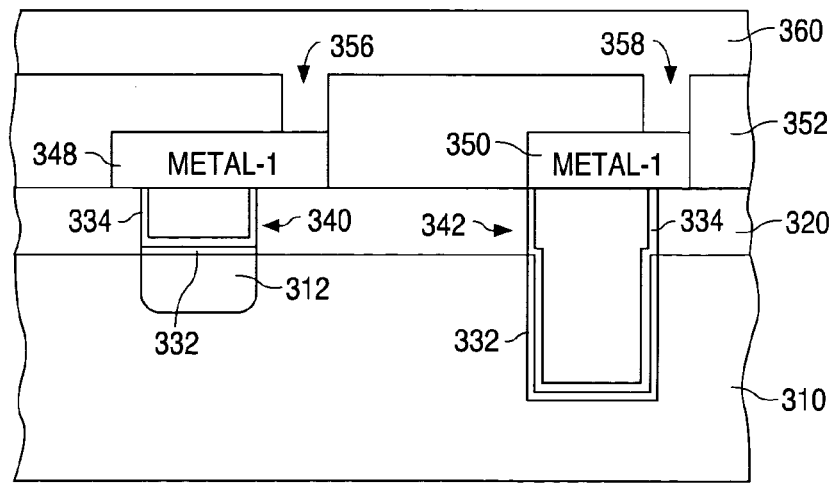
Figure 3M:
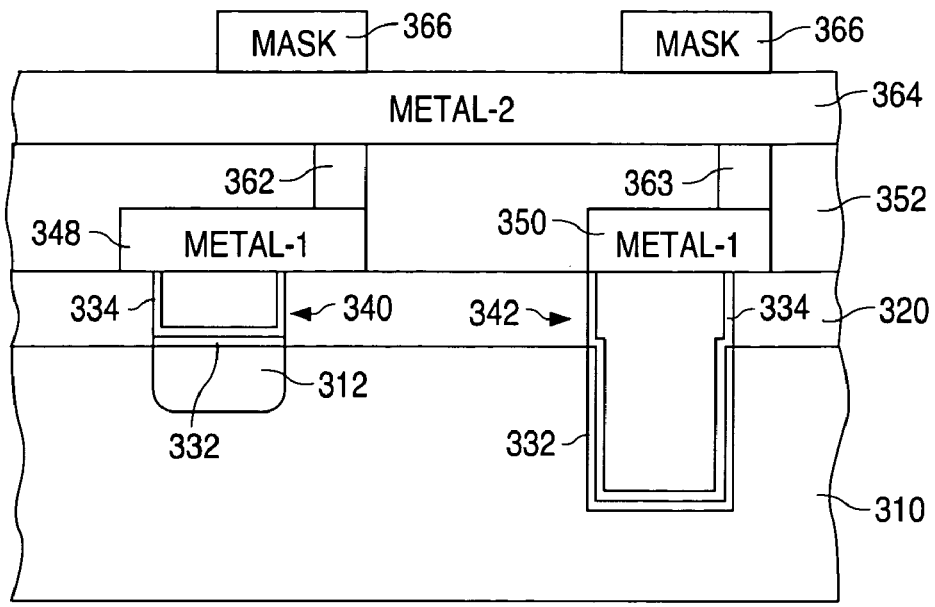
Figure 3N:
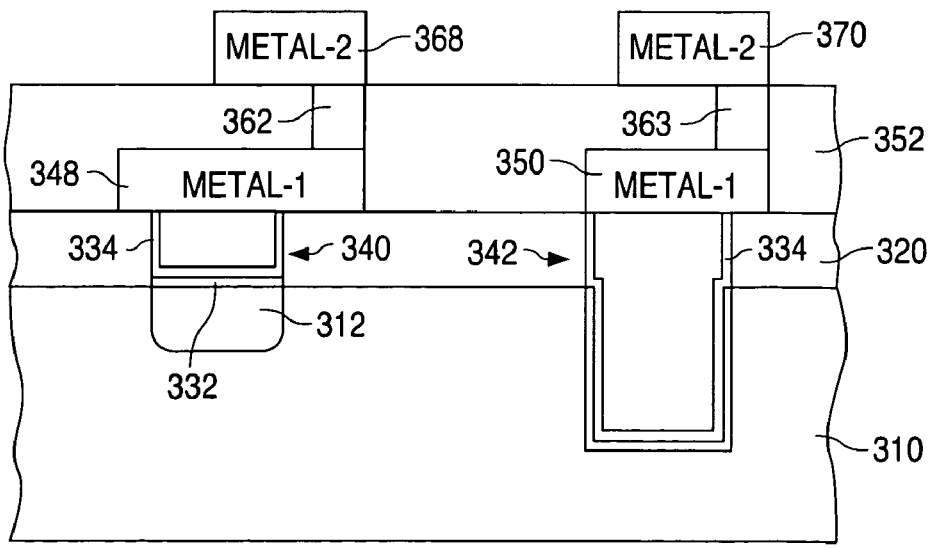
Figure 3O:
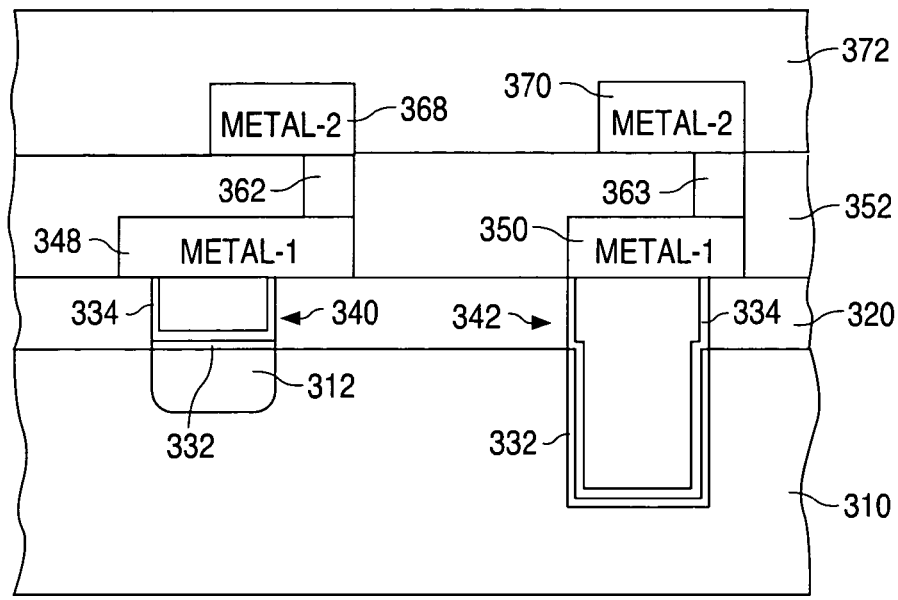
Figure 3P:
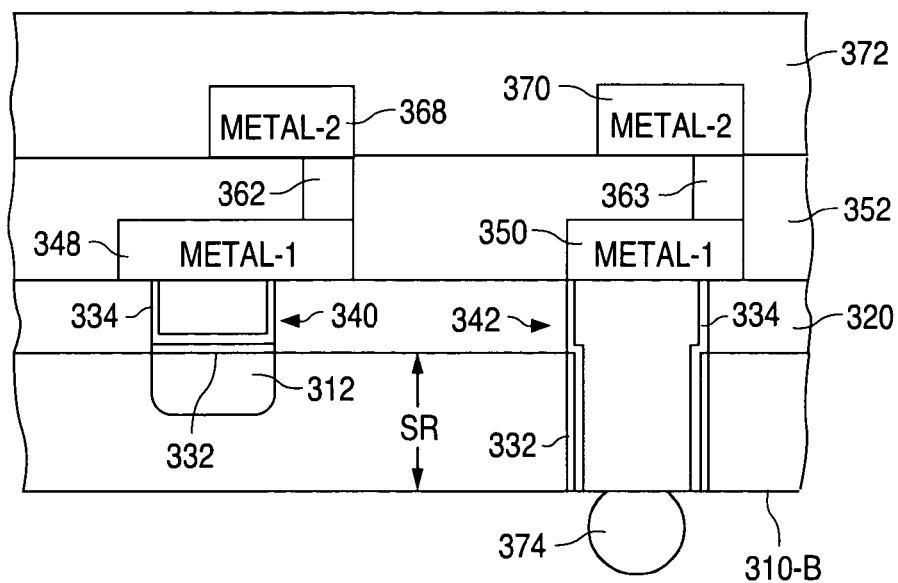

FIGS. 3A–3P show cross-sectional views that illustrate an example of a method of processing a semiconductor wafer 300 to form a die, such as die 200, in accordance with the parent invention. Wafer 300, which can be used in any semiconductor fabrication process, is sized according to the requirements of the process.

For example, wafer 300 can have a diameter of approximately 200 mils, and an initial wafer thickness of approximately 20–25 mils. Wafer 300 can also have a diameter greater than approximately 200 mils, and an initial wafer thickness of approximately 30 mils.

Prior to beginning the method of the parent invention, wafer 300, which includes a large number of substrate regions, is conventionally processed to form an identical semiconductor circuit in each substrate region. Each semiconductor circuit, in turn, includes a doped region.

FIG. 3A shows a substrate region 310 and a doped region 312 that is formed in substrate region 310. Substrate region 310 has a top surface 310-T and a bottom surface 310-B. Doped region 312 can have the same or an opposite conductivity type as substrate region 310. When substrate region 310 and doped region 312 share the same conductivity type, doped region 312 has a greater dopant concentration than substrate region 310.

In addition, substrate region 310 has a substrate thickness ST that is approximately equal to the initial wafer thickness. (Oxidization steps that are used during the fabrication of the semiconductor circuits on wafer 300 consume a small amount of the back side silicon of wafer 300/substrate 310.)

Referring to FIG. 3A, the method of the parent invention begins by forming a layer of masking material 314 over substrate region 310. Once formed, material 314 is then patterned to expose a number of trench areas on top surface 310-T of substrate region 310. The trench areas are vertically aligned with where the package bonding pads would normally be formed, such as around the periphery of the package.

Referring to FIG. 3B, once masking material 314 has been patterned, the trench area of substrate 310 is anisotropically etched until a trench opening 316 has been formed in substrate 310. Trench opening 316 can be formed to have a variety of shapes by utilizing both anisotropic and isotropic etches.

In accordance with the parent invention, trench 316 is formed to have a depth D that is greater than a final thickness of substrate region 310. For example, if the final thickness of substrate region 310 is one mil thick, then trench 316 is formed to have depth D that is greater than one mil, e.g., 27 microns (1 mil=25.4 microns). Following the etch, masking material 314 is removed.

Referring to FIG. 3C, after material 314 has been removed, a layer of insulation material 320 is formed over substrate region 310, including doped region 312 and trench 316. Insulation layer 320 can include, for example, a first layer of oxide approximately 1000 Å thick that is formed over substrate region 310, and a layer of polysilicon-doped spin-on-glass (PSG) approximately 4000 Å thick that is formed on the first oxide layer. In addition, material 320 can also include a second layer of oxide approximately 8000 Å thick that is formed on the PSG layer. The first and second layers of oxide, in turn, can be formed using plasma-enhanced chemical-vapor-deposition (PECVD) processes.

Following the formation of insulation layer 320, a layer of masking material 322 is formed on insulation layer 320. As shown in FIG. 3C, material 322 is then patterned to expose doped region 312 and trench 316.

Referring to FIG. 3D, once masking material 322 has been patterned, the exposed regions of insulation material 320 are etched until insulation material 320 is removed from the surfaces of doped region 312 and trench 316. The etch forms a contact opening 324 in insulation layer 320 that exposes doped region 312 and a trench opening 326 that exposes trench 316 opening. Following the etch, masking material 322 is removed.

Next, as shown in FIG. 3E, a layer of contact protection material 330 is deposited on doped region 312, trench 316, and insulation layer 320. After material 330 has been deposited, wafer 300 is then heated to a low temperature (e.g., 250–400° C.) in a neutral ambient, such as $N_2$, for a predetermined period of time.

As shown in FIG. 3F, the heat cycle causes the contact protection material 330 that is in contact with doped region 312 and trench 316 to react with the silicon and form a layer of metal silicide 332 on the surfaces of doped region 312 and trench 316. For example, metal silicide layer 332 can be implemented with platinum silicide, cobalt silicide, or titanium silicide. The unreacted contact protection material 330 (the material in contact with insulation layer 320) is then removed.

After metal silicide layer 332 has been formed on the surfaces of doped region 312 and trench 316, a layer of diffusion barrier material 334 is formed on metal silicide layer 332 and insulation layer 320. Diffusion barrier material 334 can be implemented with, for example, titanium, titanium-tungsten, titanium nitride, and tungsten. Following this, a layer of electrically-conductive contact material 336, such as aluminum, is formed on layer 334.

As shown in FIG. 3G, once contact material 336 has been formed, contact material 336 and then diffusion barrier material 334 are planarized to remove material 334 from the top surface of insulation layer 320. Materials 334 and 336 can be planarized using, for example, chemical-mechanical polishing (CMP) and etch back techniques. The etch forms a conductive contact 340 that makes an electrical contact with doped region 312. The etch also forms a conductive contact 342 that extends well into substrate region 310.

Referring to FIG. 3H, following the etch, a first layer of metal (metal-1) 344 is formed on insulation layer 320, contact 340, and contact 342. After metal-1 layer 344 has been deposited, a first metal trace mask 346 is formed and patterned on metal-1 layer 344.

Referring to FIG. 3I, following the patterning of mask 346, the exposed portion of metal-1 layer 344 is etched until metal-1 layer 344 is removed from the surface of the underlying insulation layer 320. Mask 346 is then removed. The etch defines a first metal-1 trace 348 and a second metal-1 trace 350, and exposes regions of insulation layer 320.

Referring to FIG. 3J, after first metal trace mask 346 has been removed, a layer of isolation material 352 is deposited on the surfaces of metal-1 traces 348 and 350 and the exposed regions of insulation layer 320. Following this, a via mask 354 is formed and patterned on isolation layer 352.

Referring to FIG. 3K, following the patterning of via mask 354, the exposed portions of isolation layer 352 are etched to remove isolation layer 352 from metal trace 350 to form a via opening 356 and a via opening 358. After this, via mask 354 is removed. Referring to FIG. 3L, once via mask 354 has been removed, a layer of via metal 360, such as titanium, is deposited on isolation layer 352 to fill up via openings 356 and 358.

Referring to FIG. 3M, after via metal layer 360 has been deposited, via metal layer 360 is etched to remove via metal layer 360 from the top surface of isolation layer 352. The etch forms a via 362 and a via 363. Next, a second layer of metal (metal-2) 364 such as, for example, aluminum, is deposited on isolation layer 352, via 362, and via 363 to make an electrical connection with vias 362 and 363. Following this, a second metal trace mask 366 is formed and patterned on metal-2 layer 364.

Referring to FIG. 3N, after mask 366 has been patterned, the exposed portion of metal-2 layer 364 is etched until metal-2 layer 364 is removed from the surface of the underlying isolation layer 352. Following the etch, mask 366 is removed. The etch defines a first metal-2 trace 368 and a second metal-2 trace 370, and exposes regions of isolation layer 352.

Referring to FIG. 3O, after second metal trace mask 366 has been removed, a layer of passivation material 372, such as oxide and an overlying layer of nitride, is deposited on the surfaces of metal traces 368 and 370 and the exposed regions of isolation layer 352. Passivation layer 372 is formed using conventional plasma-enhanced, chemical-vapor-deposition (PECVD) techniques.

Next, in accordance with the parent invention, as shown in FIG. 3P, bottom side 310-B of substrate region 310/wafer 300 is ground down so that substrate region 310 has a thickness SR that is less than the depth D of trench 316. For example, current-generation back grinding equipment can reduce the thickness SR to approximately one mil. As a result, the back grinding exposes contact 342 on bottom side 310-B. Once contact 342 has been exposed, solder balls 374 are then formed on contact 342 adjacent to bottom side 310-B.

One advantage of the parent invention is that die 200 can be fabricated and connected to a semiconductor package for much less cost than traditional approaches. Once the passivation layer has been formed, the parent invention requires only three simple steps: grind down the back side, form solder balls, and attach to semiconductor package. The solder balls can alternately be attached directly to a printed circuit board, thereby eliminating the need for a package.

Another advantage of the parent invention is that the parent invention eliminates the need for bonding wires, thereby improving circuit performance. A further advantage of the parent invention is that a thinner substrate reduces parasitics that hinder circuit performance. In addition, a thinner substrate reduces the height of the semiconductor package, thereby improving the form factor of the package.

Figure 4A:
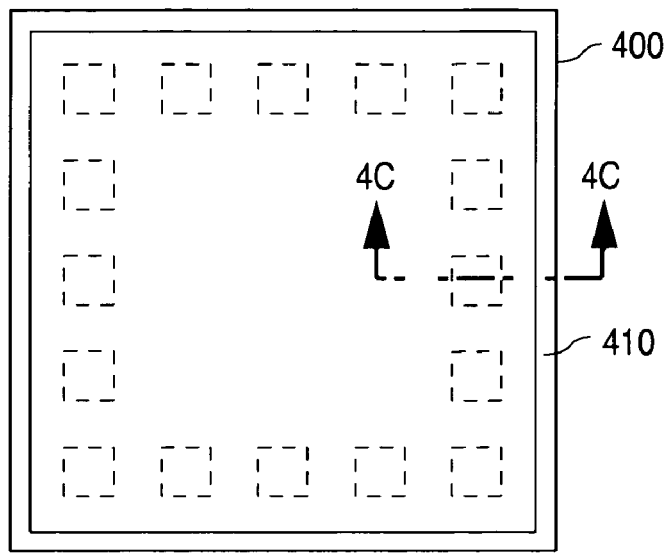
FIG. 4A is a plan view illustrating an example of a semiconductor die 400 in accordance with the present invention.
Figure 4B:
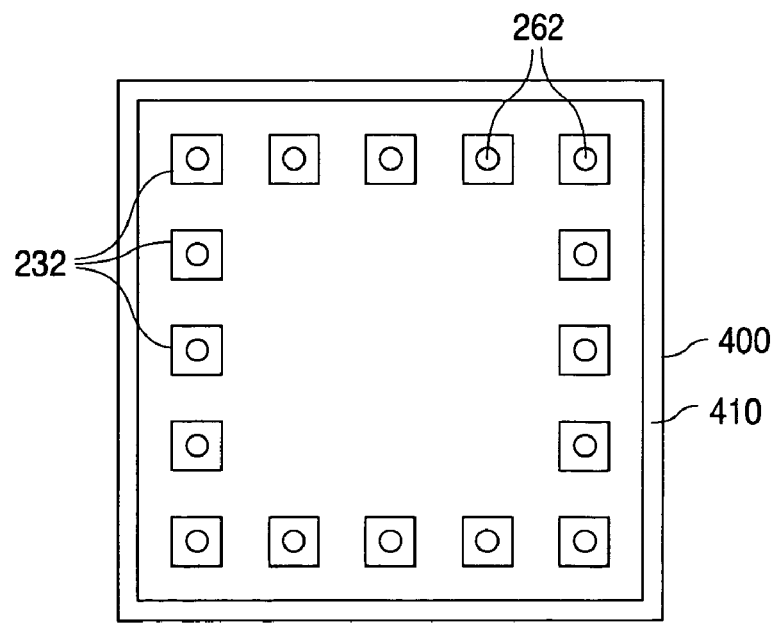
FIG. 4B is a bottom view of semiconductor die 400.
Figure 4C:
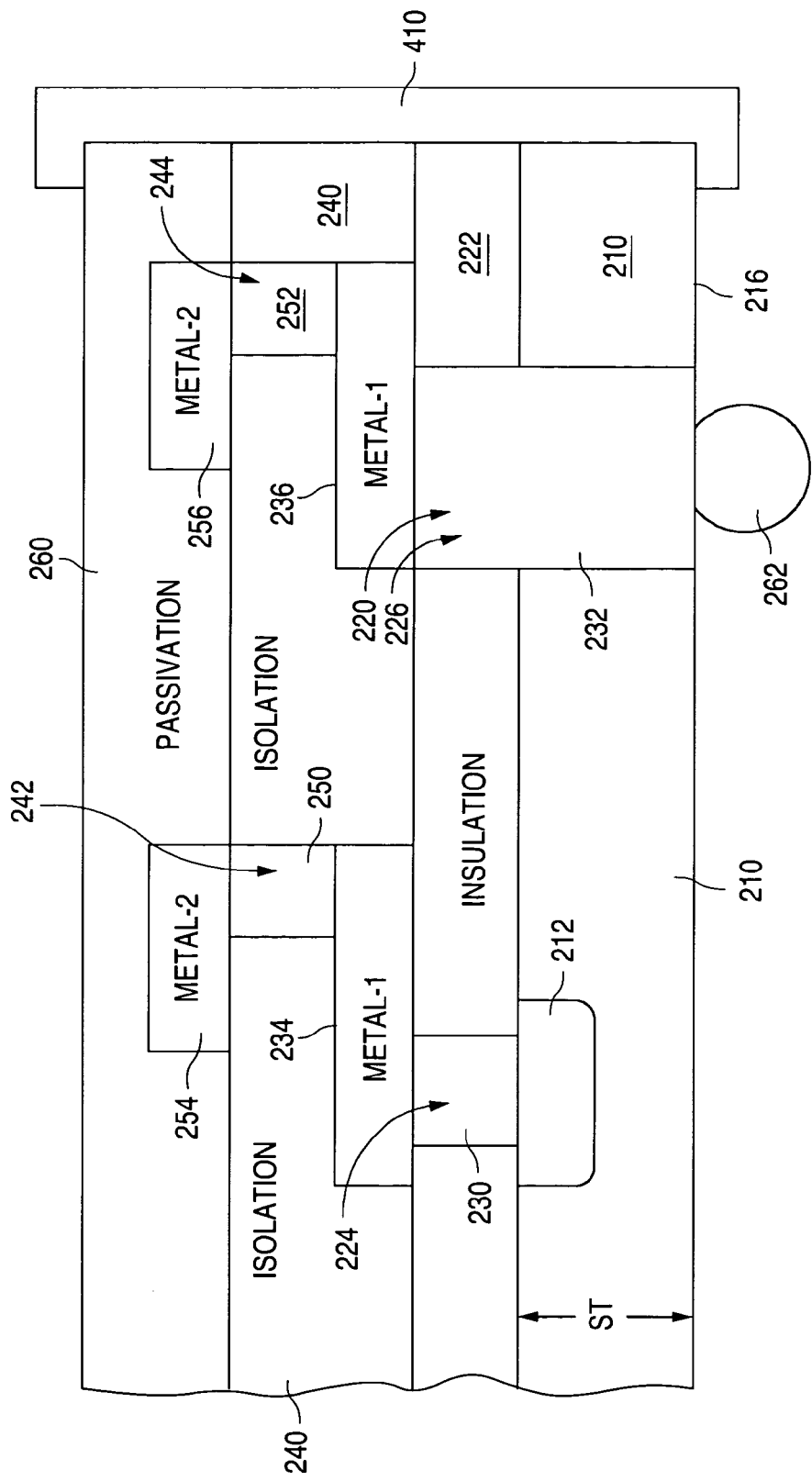
FIG. 4C is a cross-sectional view of semiconductor die 400 taken along line 4C—4C in FIG. 4A.
Figure 4D:
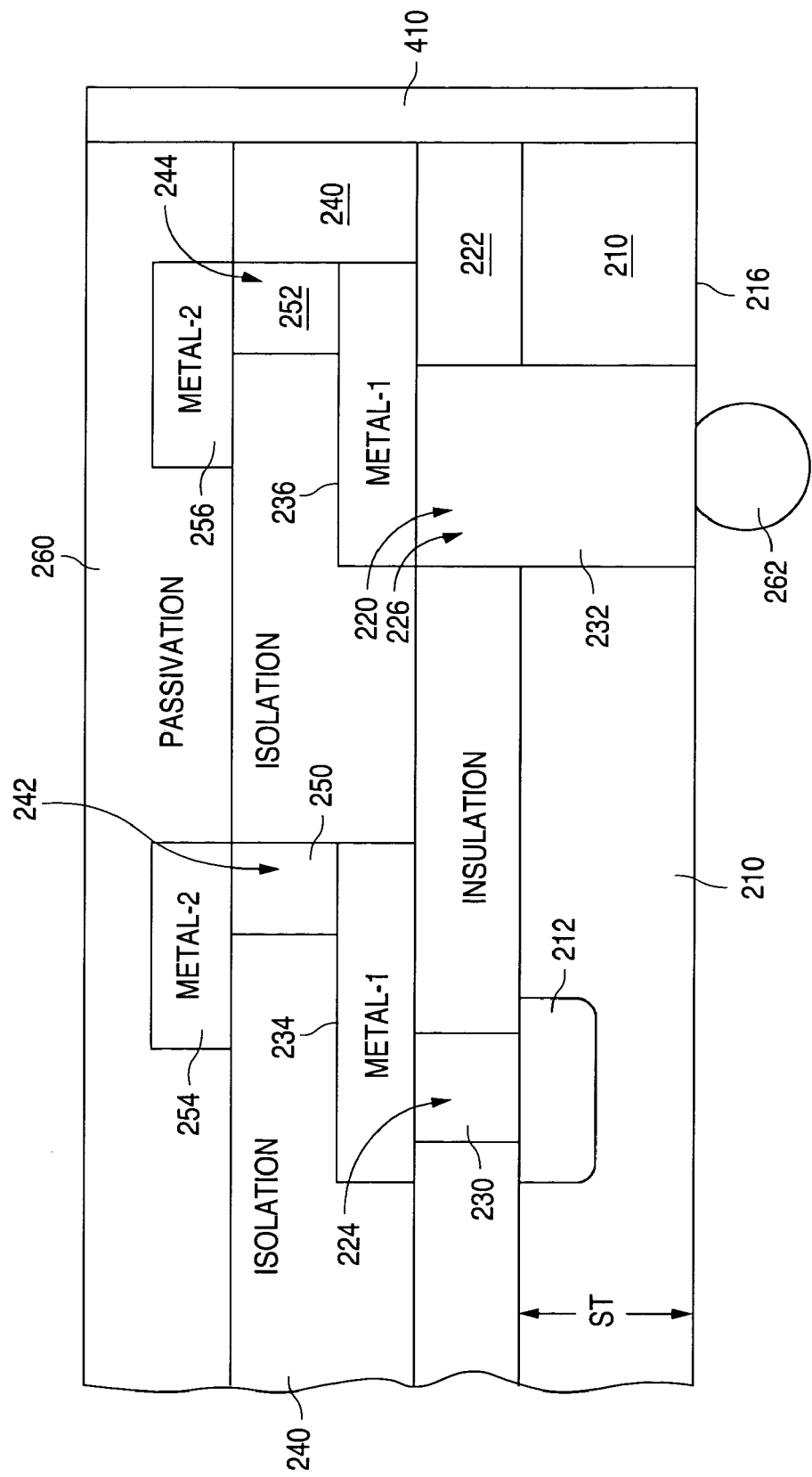
FIG. 4D is a cross-sectional view of an alternate embodiment of semiconductor die 400 taken along line 4C—4C in FIG. 4A.

FIG. 4A shows a plan view that illustrates an example of a semiconductor die 400 in accordance with the present invention. FIG. 4B shows a bottom view of semiconductor die 400. FIG. 4C shows a cross-sectional view of semiconductor die 400 taken along line 4C—4C in FIG. 4A. FIG. 4D shows a cross-sectional view of an alternate embodiment of semiconductor die 400 taken along line 4C—4C in FIG. 4A.

Die 400 is similar to die 200 and, as a result, utilizes the same reference numerals to designate the structures that are common to both die. As shown in FIGS. 4A–4C, die 400 differs from die 200 in that die 400 has hermetically sealed edges 410. FIGS. 4C and 4D show two different embodiments of edges 410.

FIGS. 5A–5D show cross-sectional views that illustrate an example of a method of processing a semiconductor wafer 500 to form a die, such as die 400, in accordance with the present invention. The method follows the steps illustrated in FIGS. 3A–3P, except that solder balls 374 are not added, and continues in FIG. 5A by mounting wafer 500 to an expandable, adhesive carrier substrate 510. As a result, the method shown in FIGS. 5A–5C uses the same reference numerals to designate the structures which are common to the method shown in FIGS. 3A–3P.

Figure 5A:
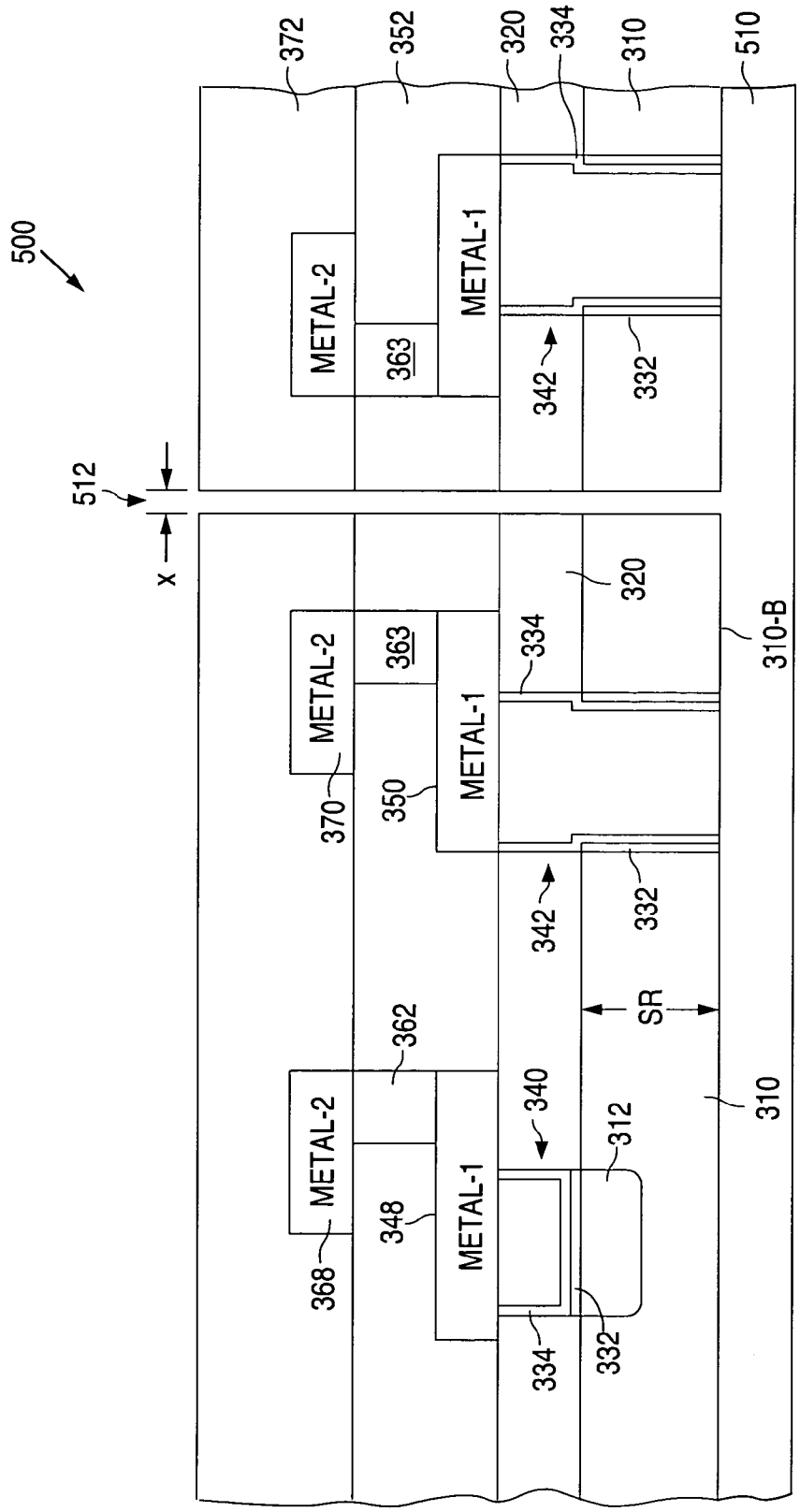
FIGS. 5A–5D are cross-sectional views illustrating an example of a method of processing a semiconductor wafer 500 to form a die, such as die 400, in accordance with the present invention.
Figure 5B:
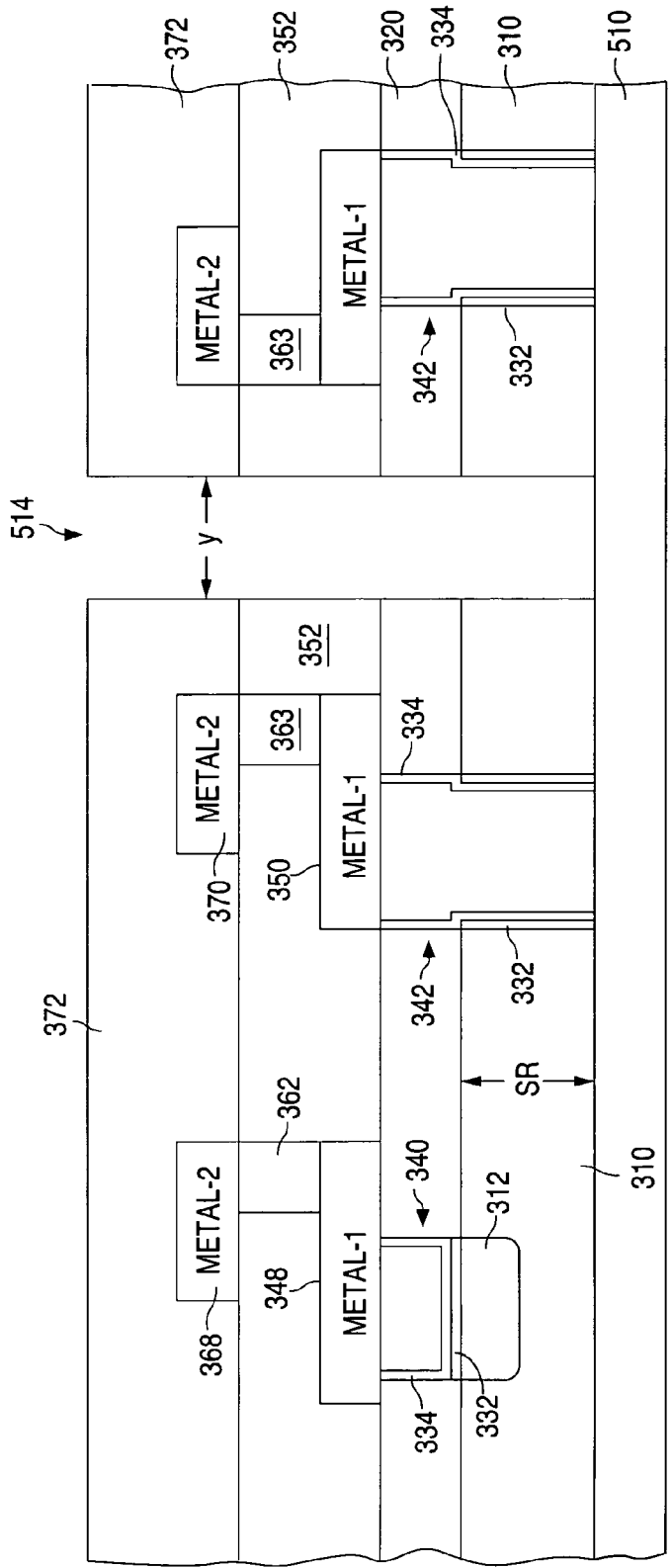

Following this, wafer 500 is cut, without cutting substrate 510, into a number of dice with a wafer saw. The cut produces a die-to-die opening 512 with a width X that is approximately equal to the width of the saw blade. Thus, as a result of the cut, each die has four edges which are now exposed. Following the cut, as shown in FIG. 5B, the adhesive carrier substrate 510 is expanded to produce a die-to-die opening 514 with a width Y that is greater than width X, the width of the saw blade.

Figure 5C:
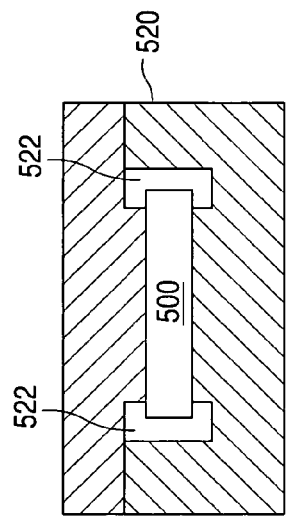

In a first alternate approach, as shown in FIG. 5C, each die is picked up by a tool and placed into a molding block 520 where a hermetic material is injected into a cavity in block 520 and hardened around the edges of each die, thereby forming hermetically sealed edges 522. Edges 522 can be transparent or opaque.

Figure 5D:
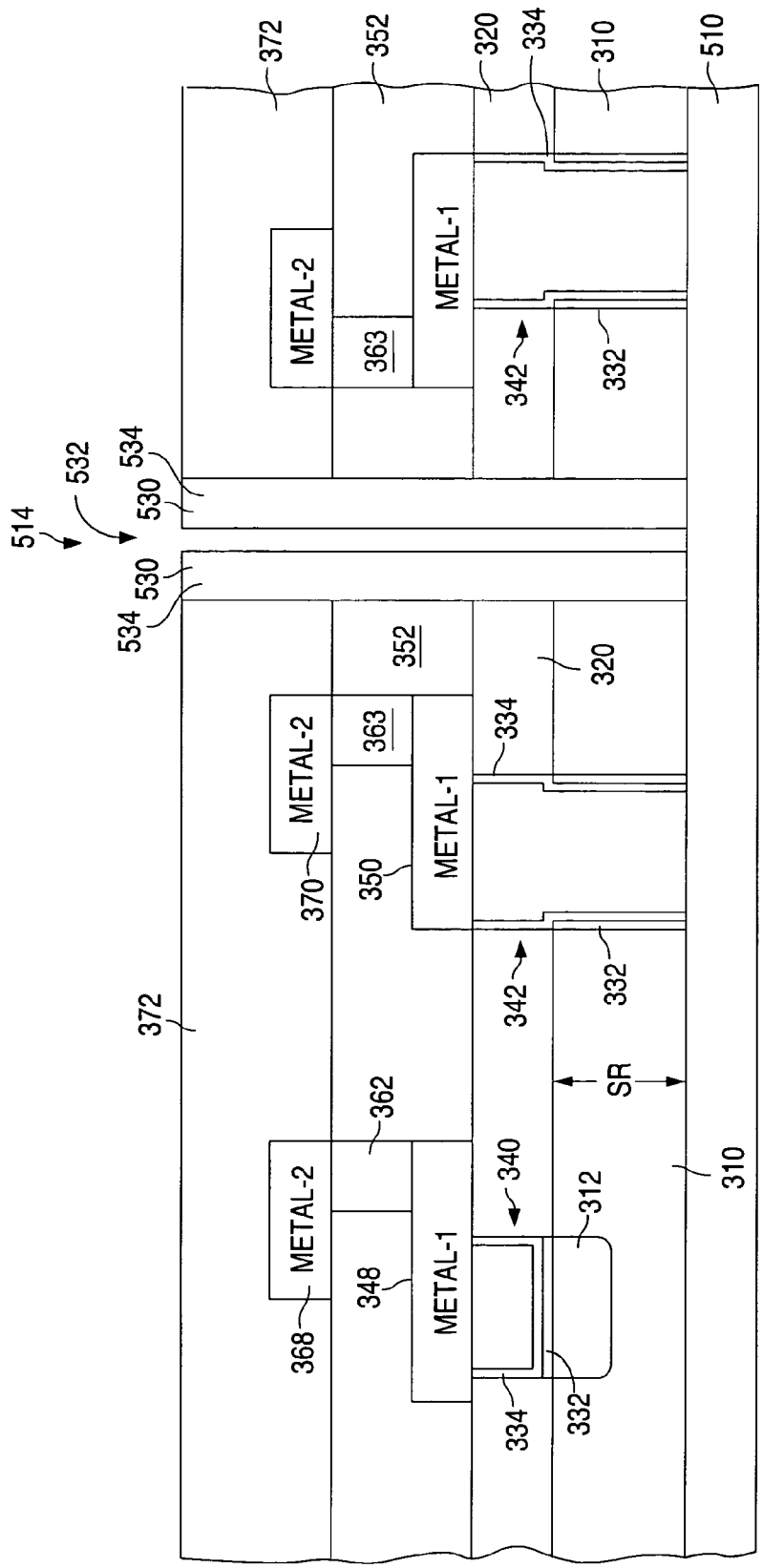

In a second alternate approach, as shown in FIG. 5D, a hermetic material 530, such as silicon nitride, is formed on each die, filling the die-to-die opening 514 with material 530. After the die-to-die opening 514 has been filled with material 530, wafer 500 is again cut, without cutting substrate 510, into a number of dice.

In accordance with the present method, the cut produces a die-to-die opening 532 that forms hermetically sealed edges 534. Following this, each die can be picked up and positioned so that solder balls 374 can be added. (If substrate 510 can be further expanded, further expansion aids in the pick up of an individual die.) Alternately, the solder balls can be attached directly to a printed circuit board.

One of the advantages of the present invention is that die 400 lacks pads and the associated structure on the top surface of die 400. As a result, the present invention can be advantageously used to include an imaging device that has less sources of pad-related interference.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A method of processing a wafer, the wafer having:

a semiconductor material that has a top surface and a bottom surface;

a doped region that contacts the top surface of the semiconductor material and is spaced apart from the bottom surface of the semiconductor material, the semiconductor material and doped region having opposite conductivity types; and a plurality of conductive structures that each extend from the top surface of the semiconductor material down through the semiconductor material, a bottom of each conductive structure lying below the doped region and above the bottom surface of the semiconductor material, the method comprising:

removing the bottom surface of the semiconductor material to expose the bottom of each conductive structure; and segmenting the wafer to form two or more first dice after the bottom surface of the semiconductor material has been removed, each first die having a top side, a bottom side, and a number of side wall surfaces that each extends from the bottom side to the top side, no conductive structure contacting a side wall surface.

2. The method of claim 1 and further comprising:

placing a first die in a mold;

injecting a material into the mold to form an edge protector that contacts and covers a side wall surface.

3. The method of claim 2 wherein the edge protector is opaque.

4. The method of claim 2 wherein the edge protector passes light.

5. The method of claim 1 wherein segmenting includes:

mounting the wafer on an adhesive material after the bottom of each conductive structure has been exposed; and cutting the wafer to form the first dice and a first die-to-die opening that lies between each adjacent pair of first dice, the first die-to-die opening having a first width.

6. The method of claim 5 and further comprising:

expanding the adhesive material to expand the first die-to-die opening that lies between each adjacent pair of first dice to form a second die-to-die opening that lies between each adjacent pair of first dice, the second die-to-die opening having a second width, the second width being larger than the first width;

removing a first die from the adhesive material to form a first removed die;

placing the first removed die in a mold;

injecting a material into the mold to form an edge protector that contacts and covers the side wall surfaces.

7. The method of claim 5 and further comprising:

expanding the adhesive material to expand the first die-to-die opening that lies between each adjacent pair of first dice to form a second die-to-die opening that lies between each adjacent pair of first dice, the second die-to-die opening having a second width, the second width being larger than the first width;

forming a passivation material in the second die-to-die opening that lies between each adjacent pair of first dice to fill up the second die-to-die opening that lies between each adjacent pair of first dice; and cutting the passivation material to form two or more second dice, and a third die-to-die opening that lies between each adjacent pair of second dice after forming the passivation material, the third die-to-die opening having the first width, each second die having a number of sidewalls protected by the passivation material.

8. The method of claim 7 wherein the sidewalls are opaque.

9. The method of claim 7 wherein the sidewalls pass light.

10. The method of claim 1 wherein removing the bottom surface of the semiconductor material removes a substantially uniform amount of the bottom surface of the semiconductor material across all of the bottom surface of the semiconductor material until the bottom of each conductive structure has been exposed.

11. The method of claim 10 and further comprising:
placing a first die in a mold; and
injecting a material into the mold to form an edge protector that contacts and covers the side wall surfaces.

12. The method of claim 11 wherein the edge protector is opaque.

13. The method of claim 11 wherein the edge protector passes light.

14. The method of claim 11 wherein the conductive structures include a metallic material.

15. The method of claim 10 wherein:
a conductive structure is electrically connected to the doped region; and
the conductive structure includes a metallic material.

16. The method of claim 15 and further comprising:
placing a first die in a mold; and
injecting a material into the mold to form an edge protector that contacts and covers the side wall surface.

17. The method of claim 10 wherein segmenting includes:
mounting the wafer on an adhesive material after the bottom of each conductive structure has been exposed; and
cutting the wafer to form the first dice and a first die-to-die opening that lies between each adjacent pair of first dice, the first die-to-die opening having a first width.

18. The method of claim 17 and further comprising:
expanding the adhesive material to expand the first die-to-die opening that lies between each adjacent pair of first dice to form a second die-to-die opening that lies between each adjacent pair of first dice, the second die-to-die opening having a second width, the second width being larger than the first width;
removing a first die from the adhesive material to form a first removed die;
placing the first removed die in a mold;
injecting a material into the mold to form an edge protector that contacts and covers a side wall surface.

* * * * *

UNITED STATES PATENT AND TRADEMARK OFFICE
CERTIFICATE OF CORRECTION

| | | |
|---|---|---|
| PATENT NO. | : 7,109,571 B1 | Page 1 of 1 |
| APPLICATION NO. | : 10/832786 | |
| DATED | : September 19, 2006 | |
| INVENTOR(S) | : Padmanabhan et al. | |

It is certified that error appears in the above-identified patent and that said Letters Patent is hereby corrected as shown below:

<u>Column 10,</u>

Line 28, insert

--19. The method of claim 17 and further comprising:

expanding the adhesive material to expand the first die-to-die opening that lies between each adjacent pair of first dice to form a second die-to-die opening that lies between each adjacent pair of first dice, the second die-to-die opening having a second width, the second width being larger than the first width;

forming a passivation material in the second die-to-die opening that lies between each adjacent pair of first dice to fill up the second die-to-die opening that lies between each adjacent pair of first dice; and cutting the passivation material to form two or more second dice and a third die-to-die opening that lies between each adjacent pair of second dice after forming the passivation material, the third die-to-die opening having the first width, each second die having a number of sidewalls protected by the passivation material.--

Signed and Sealed this

Twentieth Day of February, 2007

JON W. DUDAS
*Director of the United States Patent and Trademark Office*